(12) United States Patent
Taguchi et al.

(10) Patent No.: US 8,039,967 B2
(45) Date of Patent: Oct. 18, 2011

(54) WIRING SUBSTRATE WITH A WIRE TERMINAL

(75) Inventors: Yuichi Taguchi, Nagano (JP); Akinori Shiraishi, Nagano (JP); Mitsutoshi Higashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 82 days.

(21) Appl. No.: 12/686,590

(22) Filed: Jan. 13, 2010

(65) Prior Publication Data

US 2010/0193939 A1    Aug. 5, 2010

(30) Foreign Application Priority Data

Feb. 4, 2009    (JP) .................................. 2009-23411

(51) Int. Cl.
| | |
|---|---|
| H01L 23/48 | (2006.01) |
| H01L 21/44 | (2006.01) |
| H05K 7/00 | (2006.01) |

(52) U.S. Cl. . 257/773; 257/784; 257/786; 257/E23.024; 361/760; 361/792; 438/617

(58) Field of Classification Search ........................ None
See application file for complete search history.

(56) References Cited

U.S. PATENT DOCUMENTS

| | | | | |
|---|---|---|---|---|
| 7,307,348 | B2 * | 12/2007 | Wood et al. | 257/774 |
| 7,371,676 | B2 * | 5/2008 | Hembree | 438/617 |
| 7,579,267 | B2 * | 8/2009 | Wood et al. | 438/617 |
| 7,919,846 | B2 * | 4/2011 | Hembree | 257/686 |
| 2006/0228825 | A1 * | 10/2006 | Hembree | 438/51 |
| 2007/0167000 | A1 * | 7/2007 | Wood et al. | 438/629 |
| 2008/0157361 | A1 * | 7/2008 | Wood et al. | 257/738 |

FOREIGN PATENT DOCUMENTS

JP    2007-132687 A1    5/2007

* cited by examiner

*Primary Examiner* — Alonzo Chambliss
(74) *Attorney, Agent, or Firm* — Kratz, Quintos & Hanson, LLP

(57) ABSTRACT

A wiring substrate includes a silicon substrate, a through hole formed to penetrate the silicon substrate in a thickness direction, an insulating layer formed on both surfaces and side surfaces of the silicon substrate and an inner surface of the through hole, a penetration electrode formed in the through hole, a wiring layer formed on at least one surface of the silicon substrate and connected to the penetration electrode, and a metal wire terminal connected to the wiring layer and formed to extend from one surface of the silicon substrate to a side surface thereof. The metal wire terminal on the side surface of the electronic device is connected to the mounting substrate such that a substrate direction of the electronic device in which an electronic component is mounted on the wiring substrate intersects orthogonally with a substrate direction of the mounting substrate.

10 Claims, 12 Drawing Sheets

FIG.4A (fragmental plan view)

(fragmental plan view)

WIRING SUBSTRATE WITH A WIRE TERMINAL

CROSS-REFERENCE TO RELATED APPLICATIONS

This application is based on and claims priority of Japanese Patent Application No. 2009-023411 filed on Feb. 4, 2009, the entire contents of which are incorporated herein by reference.

BACKGROUND OF THE INVENTION

1. Field of the Invention

The present invention relates to a wiring substrate, an electronic device, and an electronic device mounting structure and, more particularly, a wiring substrate in which connection terminals are provided on its side surface, an electronic device in which an electronic component is mounted on the wiring substrate, and an electronic device mounting structure in which the electronic device is mounted on a mounting substrate.

2. Description of the Related Art

In the prior art, there is the electronic device in which the connection terminals are provided on the side surface side of a package. In Patent Literature 1 (Patent Application Publication (KOKAI) 2007-132687), the ceramic package for an acceleration sensor is disclosed, and it is set forth that the ceramic package has a hexahedron, lead terminals are provided redundantly on a bottom surface and a side surface that intersects orthogonally mutually, and an acceleration sensor is mounted on a circuit substrate by selecting either of the bottom surface and the side surface.

However, in the package (wiring substrate) formed of the ceramic, it is difficult to form micro wirings. Therefore, it is difficult to serve as a mounting substrate for a high-performance electronic component. For this reason, the wiring substrate having a new structure, in which the micro wirings can be formed and which has the connection terminals on a side surface side of the substrate, is demanded.

SUMMARY OF THE INVENTION

It is an object of the present invention to provide a wiring substrate, an electronic device, and an electronic device mounting structure, in which micro wirings can be formed and connection terminals can be formed easily on a side surface side of a substrate.

The present invention is concerned with a wiring substrate including a silicon substrate; a through hole formed to penetrate the silicon substrate in a thickness direction; an insulating layer formed on both surfaces and side surfaces of the silicon substrate and an inner surface of the through hole; a penetration electrode formed in the through hole; a wiring layer formed on at least one surface of the silicon substrate, and connected to the penetration electrode; and a metal wire terminal connected to the wiring layer, and formed to extend from the one surface of the silicon substrate to a side surface thereof.

In the wiring substrate of the present invention, the through holes are formed in the silicon substrate, and the insulating layer is formed on both surfaces and side surfaces of the silicon substrate and the inner surfaces of the through holes. The penetration electrode is formed in the through holes respectively, and the wiring layers connected to the penetration electrode respectively are formed on one surface of the silicon substrate.

Also, the metal wire terminals connected to the wiring layers are provided from the one surface of the silicon substrate to the side surface thereof. The metal wire terminal is made of a gold wire which is formed by the wire bonding method, for example.

Then, the electronic component connected electrically to the penetration electrodes is mounted on the opposite surface to the surface on which the wiring layers are formed, in the silicon substrate, and thus the electronic device is constructed.

In the present invention, the silicon substrate in which the micro wirings can be formed is employed as the substrate, and the metal wire terminals are provided on the side surface of the silicon substrate as the connection terminals. Accordingly, the wiring substrate can be applied to the mounting of the high-performance electronic component, and also the side surface of the electronic device can be connected and mounted to the mounting substrate.

That is, the electronic device is mounted on the mounting substrate such that the substrate direction of the electronic device intersects orthogonally with the substrate direction of the mounting substrate. In the case that the mounting substrate is arranged upright in the vertical direction, the metal wire terminals on the side surface of the electronic device are connected and mounted to the mounting substrate, and the electronic device is mounted such that its substrate direction is directed in the horizontal direction.

In one preferred mode of the present invention, the electronic component is the MEMS acceleration sensor. When the MEMS acceleration sensor is to be mounted, it is necessary to mount the MEMS acceleration sensor such that its substrate direction may be arranged to the horizontal direction on account of its property. In the electronic device of the present invention, in the case that the mounting substrate is arranged upright in the vertical direction, the MEMS acceleration sensor can be mounted in the horizontal direction by connecting the metal wire terminals provided on the side surface of the electronic device to the mounting substrate.

In this manner, in the case that the mounting substrate is arranged upright in the vertical direction, the MEMS acceleration sensor can be mounted in the horizontal direction such that the MEMS acceleration sensor functions normally.

Alternatively, in the case that the electronic component is the semiconductor chip, the electronic device can be mounted such that its substrate direction stands to the vertical direction by connecting the metal wire terminals provided on the side surface of the electronic device to the mounting substrate arranged in the horizontal direction. In the case of this mode, a mounting area of the mounting substrate occupied in the horizontal direction can be made small.

After the metal wire terminals provided on the side surface of the electronic device are mounted and connected to the mounting substrate, the reinforcing resin may be formed around the connection area of the electronic device to reinforce the connection of the electronic device. As a result, particularly in the case that the electronic device is mounted to direct its substrate direction to the horizontal direction, inclining to the lower side can be prevented and reliability of the mounting can be improved.

Also, the grooves may be formed on the side surface of the silicon substrate, and then a level difference of the metal wire terminals may be eliminated by fitting the metal wire terminals into the grooves. As a result, unsteadiness of the electronic device can be reduced upon mounting the electronic device, and thus the electronic device can be connected to the mounting substrate with good reliability.

As explained above, in the wiring substrate of the present invention, the micro wirings can be formed and the connection terminals can be formed easily on the side surface side of the substrate.

BRIEF DESCRIPTION OF THE DRAWINGS

FIGS. 4A and 4B are sectional views (#4) showing the method of manufacturing the wiring substrate according to the embodiment of the present invention;

DETAILED DESCRIPTION OF THE PREFERRED EMBODIMENTS

Embodiments of the present invention will be explained with reference to the accompanying drawings hereinafter.

Figure 1:
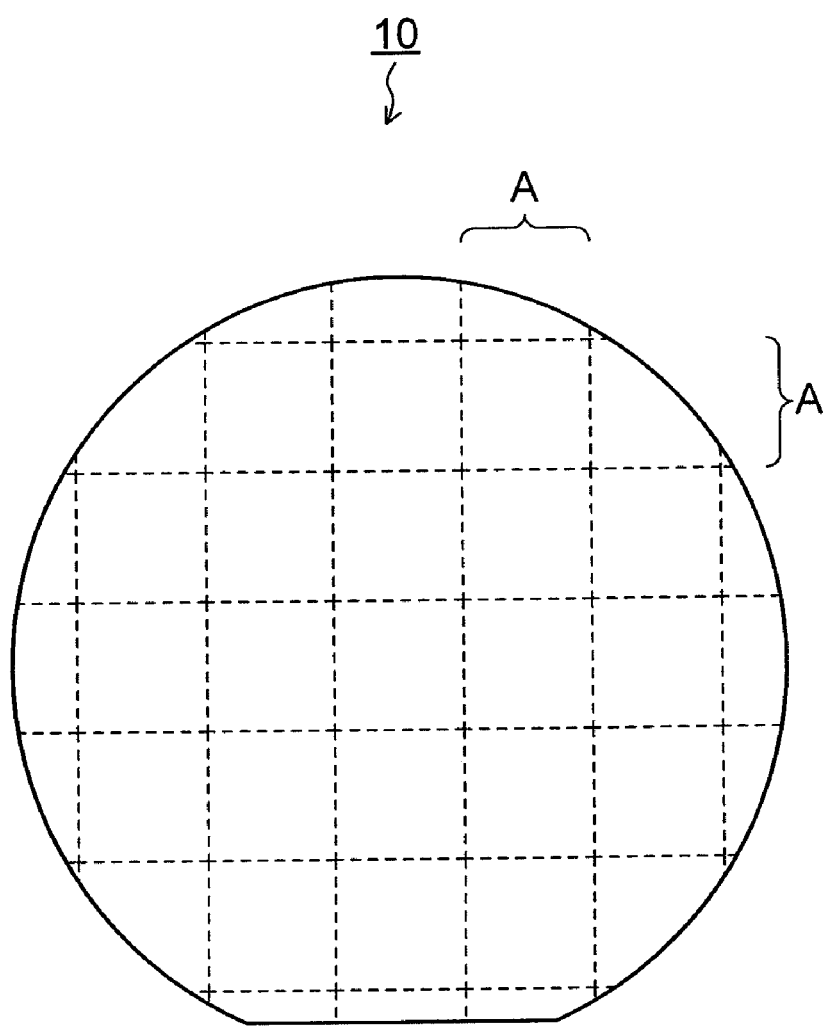
FIG. 1 is a plan view (#1) showing a method of manufacturing a wiring substrate according to an embodiment of the present invention.
Figure 6A:
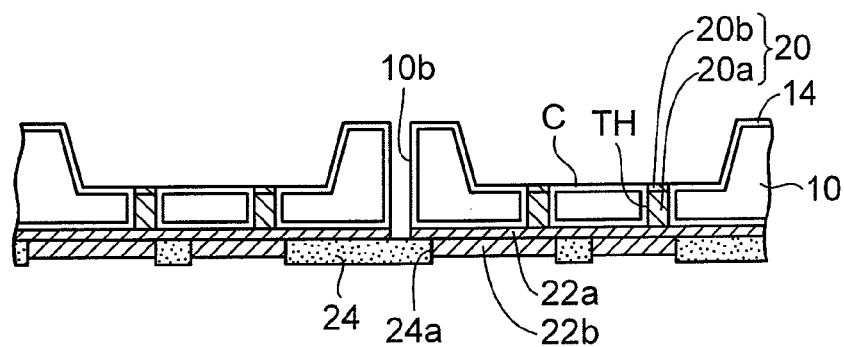
FIGS. 6A to 6C are sectional views (#6) showing the method of manufacturing the wiring substrate according to the embodiment of the present invention.
Figure 6B:
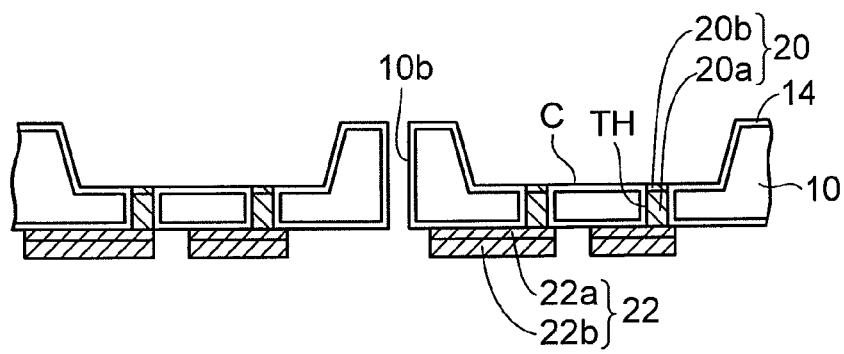
Figure 6C:
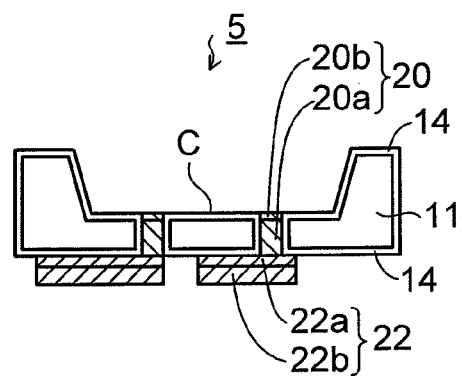
Figure 7A:
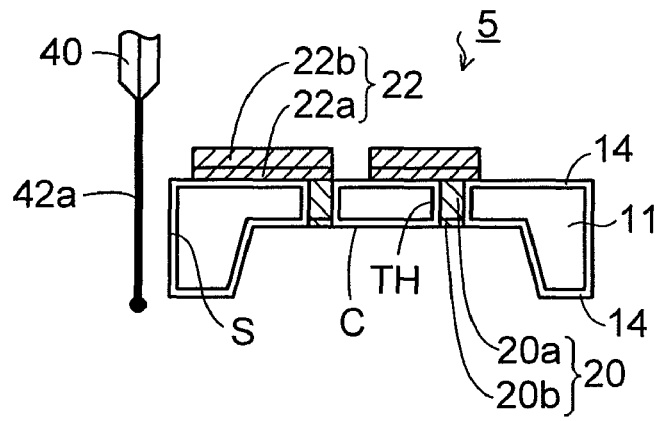
FIGS. 7A to 7C are sectional views (#7) showing the method of manufacturing the wiring substrate according to the embodiment of the present invention.
Figure 7B:
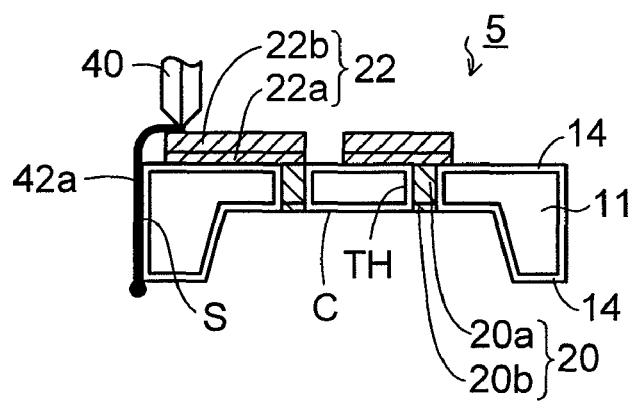
Figure 7C:
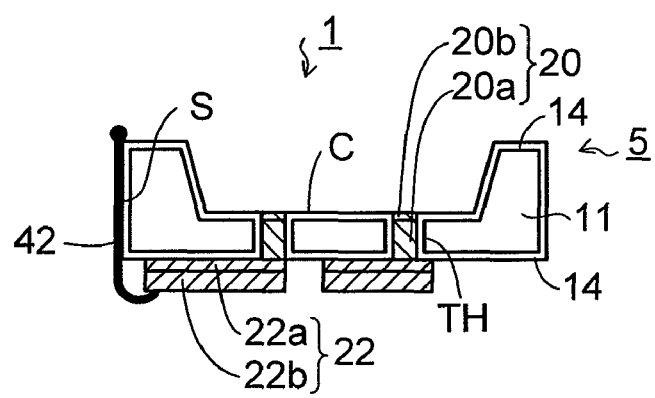
Figure 8:
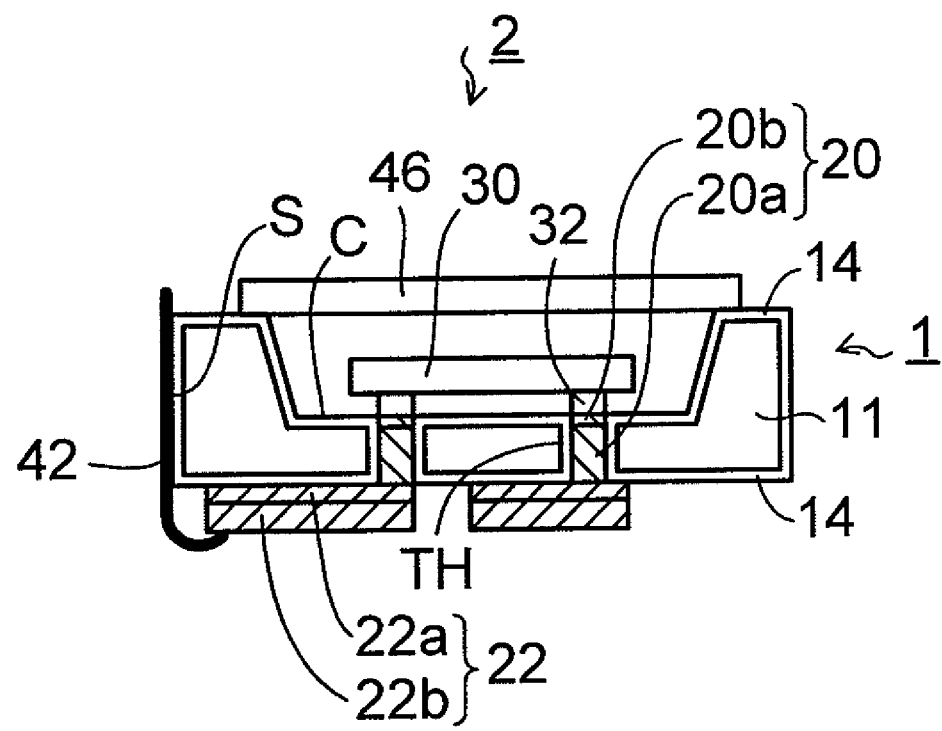
FIG. 8 is a sectional view showing an electronic device according to the embodiment of the present invention.

FIG. 1 to FIGS. 7A-7C are sectional views showing a method of manufacturing a wiring substrate according to an embodiment of the present invention, and FIG. 8 is a sectional view showing an electronic device according to the same. In the method of manufacturing the wiring substrate according to the present embodiment, first, a silicon wafer 10 shown in FIG. 1 is prepared. A thickness of the silicon wafer 10 is set to 700 to 800 μm, for example, and a large number of wiring substrate areas A are defined in the silicon wafer 10.

Figure 2A:
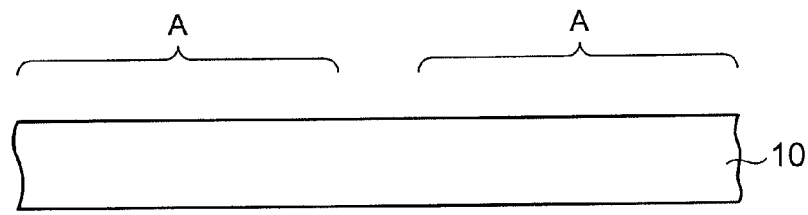
FIGS. 2A to 2D are sectional views (#2) showing the method of manufacturing the wiring substrate according to the embodiment of the present invention.

Then, as shown in FIG. 2A, a thickness of the silicon wafer 10 is made thin to about 500 μm by grinding the back surface by means of a grinder. In sectional views of FIG. 2A and subsequent Figures, two wiring substrate areas A of the silicon wafer 10 in FIG. 1 are partially depicted.

Figure 2B:
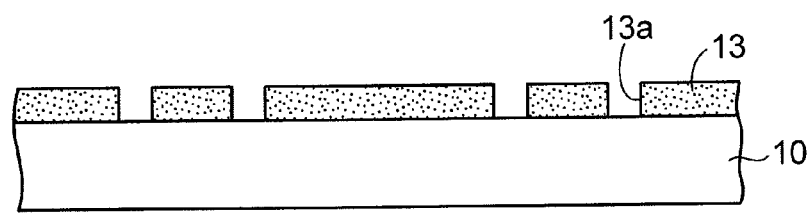

Then, as shown in FIG. 2B, a resist 13 in which opening portions 13a having a hole shape are provided is formed on the silicon wafer 10 by the photolithography. The opening portion 13a of the resist 13 is formed in portions where through holes of the silicon wafer 10 are arranged.

Figure 2C:
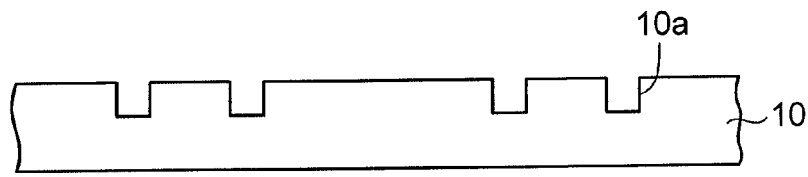

Then, as shown in FIG. 2C, the silicon wafer 10 is etched by the dry etching (RIE, or the like) through the opening portions 13a, while using the resist 13 as a mask. At this time, a plurality of hole portions 10a are formed by applying the etching up to the halfway position of thickness of the silicon wafer 10. In the case that a thickness of the silicon wafer 10 is set to 500 μm, a depth of the hole portion 10a is set to about 200 μm and a diameter of the hole portion 10a is set to 30 to 60 μm. Then, the resist 13 is removed.

Figure 2D:
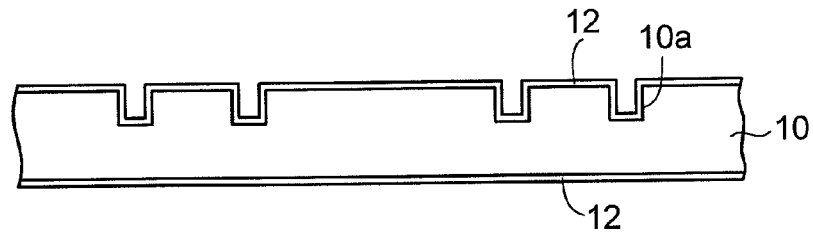

Then, as shown in FIG. 2D, an insulating layer 12 made of a silicon oxide layer is formed on both surfaces of the silicon wafer 10 and inner surfaces of the hole portions 10a by thermally oxidizing the silicon wafer 10. Alternatively, the insulating layer 12 may be obtained by forming a silicon oxide layer by means of the CVD method.

Figure 3A:
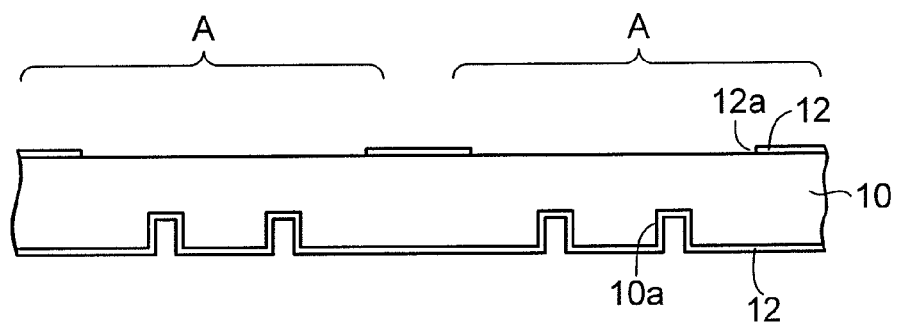
FIGS. 3A to 3C are sectional views (#3) showing the method of manufacturing the wiring substrate according to the embodiment of the present invention.

Then, as shown in FIG. 3A, the silicon wafer 10 in FIG. 2D is reversed up and down to direct the back surface side upward, and then opening portions 12a are formed in the insulating layer 12 of the upper side. The insulating layer 12 is patterned by the photolithography and the wet etching. The opening portion 12a of the insulating layer 12 is arranged in center main portions of the wiring substrate areas A respectively.

Figure 3B:
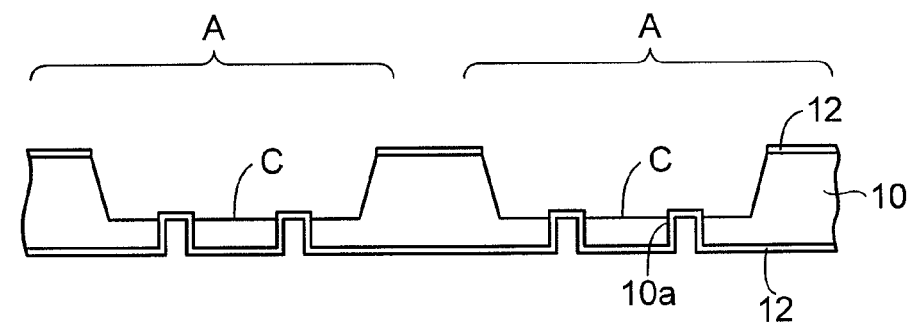

Then, as shown in FIG. 3B, the silicon wafer 10 is etched through the opening portions 12a by the wet etching, while using the insulating layer 12 as a mask. Thus, a concave portion C is formed in the center main portions of the wiring substrate areas A respectively.

At this time, the concave portion C is formed to have a depth that reaches the hole portion 10a formed in the silicon wafer 10. Since the silicon wafer 10 is selectively etched with respect to the insulating layer 12, such a situation is obtained that the insulating layer 12 on the bottom side of the hole portion 10a is protruded upward.

As described above, in the case that a thickness of the silicon wafer 10 is set to 500 and a depth of the hole portion 10a is set to about 200 μm a depth of the concave portion C is set to 300 μm or more.

Figure 3C:
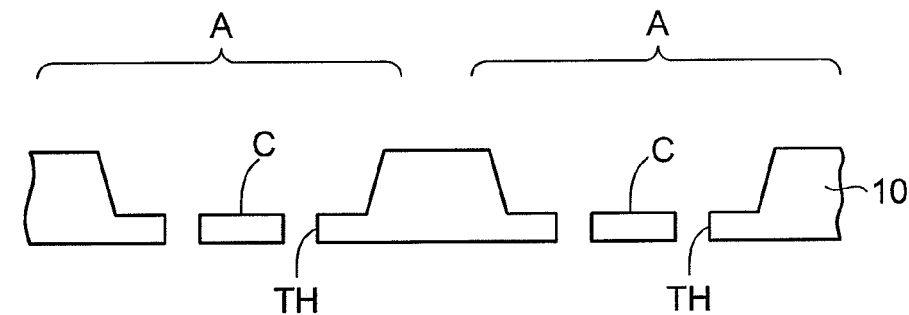

Then, as shown in FIG. 3C, the insulating layer 12 formed on the silicon wafer 10 is removed wholly by the wet etching.

Accordingly, the concave portion C is obtained in the center main portions of the wiring substrate areas A on the upper surface side of the silicon wafer 10 respectively. At the same time, the insulating layer 12 formed around the hole portion 10a is removed, so that a through hole TH which penetrates the silicon wafer 10 is provided in bottom portions of the concave portions respectively. The through holes TH are formed to communicate with the bottom portions of the concave portions C.

Then, as shown in FIG. 4A, main portions of boundary portions (dicing portions) between the wiring substrate areas A of the silicon wafer 10 are penetration-processed, and thus penetration portions 10b are formed partially. The penetration portions 10b are formed by the photolithography and the dry etching (RIE, or the like).

At this time, such a situation is obtained that the wiring substrate areas A are connected by coupling portions 10× being left at their four corners, and the silicon wafer 10 is in the wafer state with one sheet. That is, in respective wiring substrate area A, such a situation is obtained that the side surface main portions of their four sides are exposed respectively.

Figure 4B:
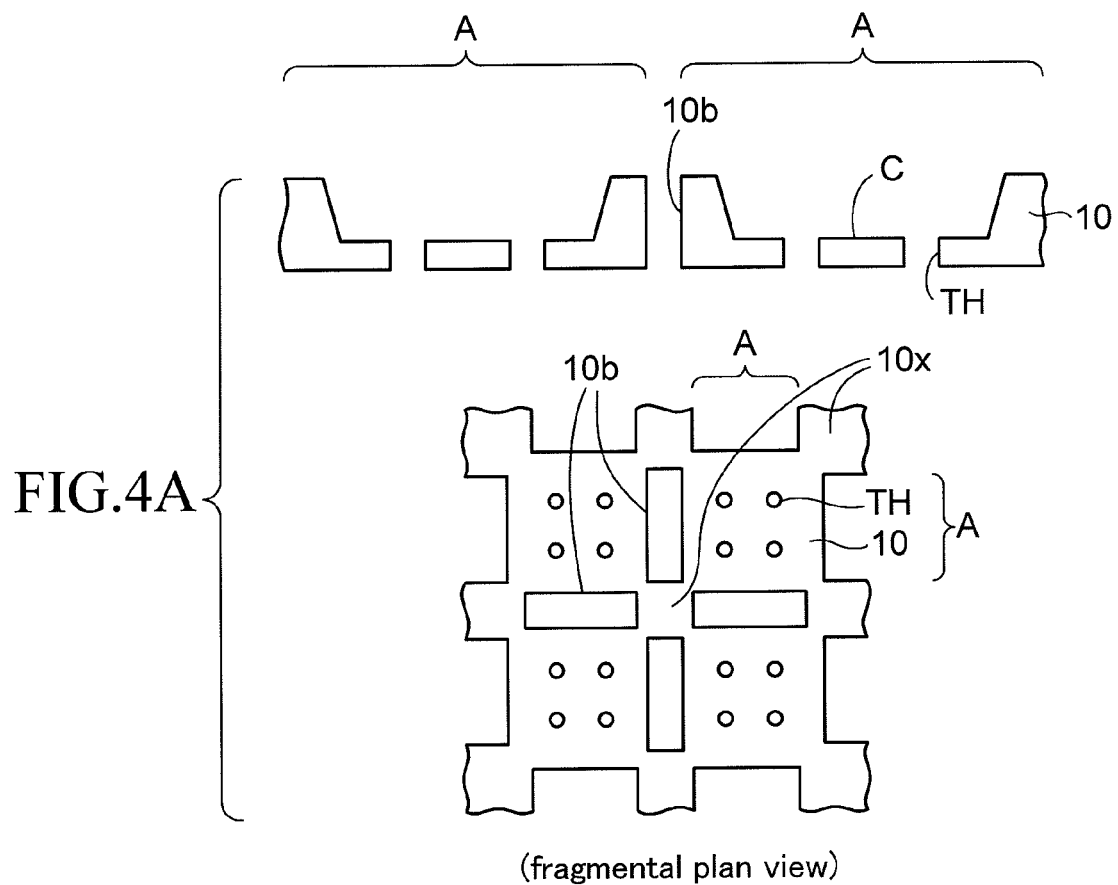
Figure 4B:
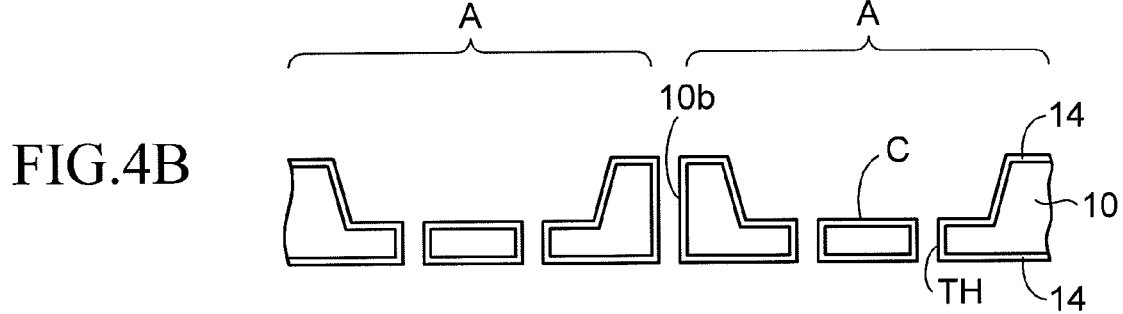

Then, as shown in FIG. 4B, an insulating layer 14 made of a silicon oxide layer is formed on both surfaces of the silicon wafer 10 and respective inner surfaces of the through holes TH and the penetration portions 10b by thermally oxidizing the silicon wafer 10. Alternatively, the insulating layer 14 may be obtained by forming a silicon oxide layer by means of the CVD method.

By this matter, the insulating layer 14 can be formed collectively and easily to the side surface main portions of four sides in respective wiring substrate area A with a state of the silicon wafer 10.

Figure 5A:
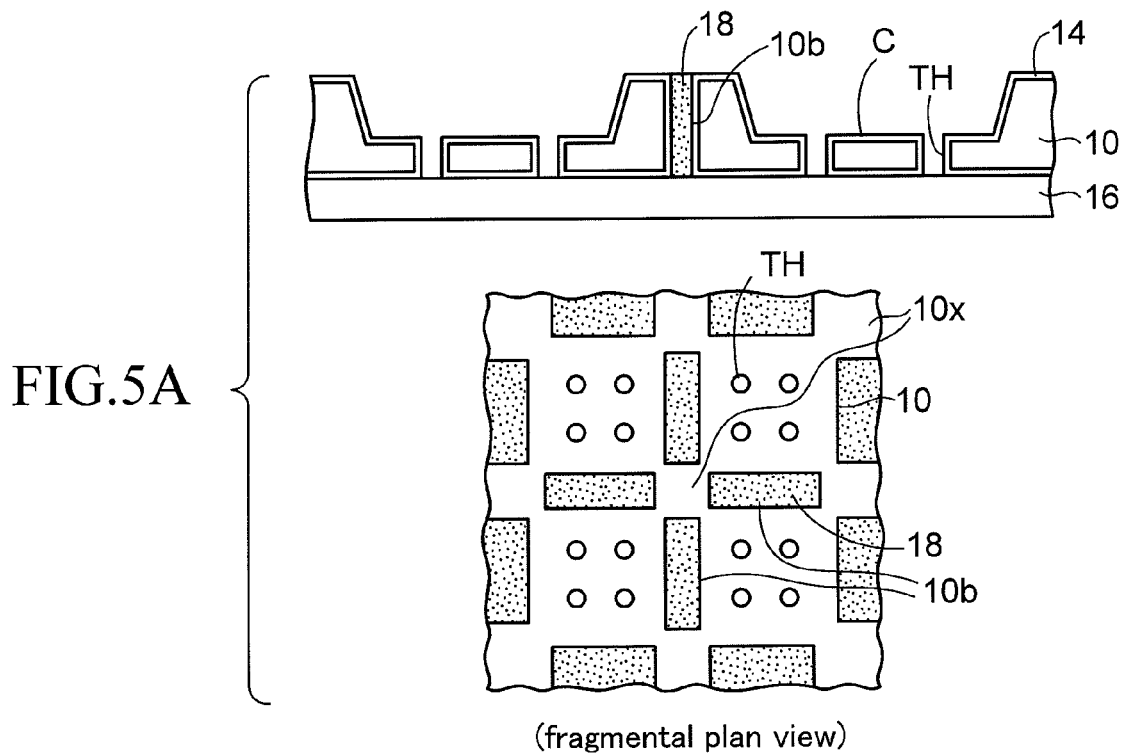
FIGS. 5A to 5D are sectional views (#5) showing the method of manufacturing the wiring substrate according to the embodiment of the present invention.

Then, as shown in FIG. 5A, the silicon wafer 10 in FIG. 4B is arranged on a plating power feeding member 16 such as a copper foil, or the like. Also, a liquid resist 18 is filled into the penetration portions 10b of the silicon wafer 10 by the dispenser, or the like, and then is dried by the baking. As shown in a fragmental plan view in FIG. 5A, the resist 18 is formed selectively only in the penetration portions 10b except the through hole TH (dot hatching portion).

Figure 5B:
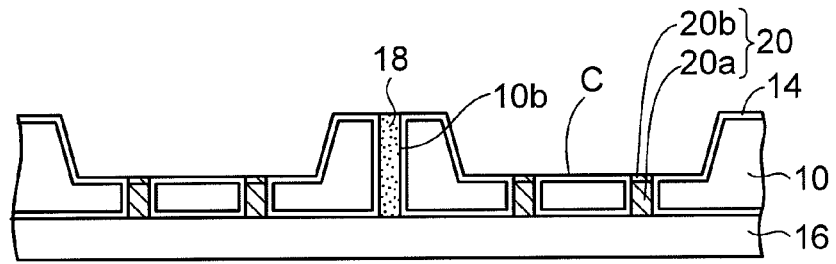

Then, as shown in FIG. 5B, a metal plating layer is filled in the through holes TH in the silicon wafer 10 by the electroplating utilizing the plating power feeding member 16 as a plating power feeding path. Thus, penetration electrodes 20 are obtained. The penetration electrode 20 is constructed by a filling metal portion 20a and a connection portion 20b formed thereon.

For example, the filling metal portion 20a is formed of a copper (Cu) plating layer, and the connection portion 20b is formed of a nickel (Ni) plating layer/a gold (Au) plating layer in order from the bottom. The material of the penetration electrode 20 is selected according to the connection specifications of the electronic component which is to be mounted.

Since the resist 18 is fill in the penetration portions 10b in the silicon wafer 10, it can be prevented that the metal plating layer is formed in the penetration portions 10b.

Figure 5C:
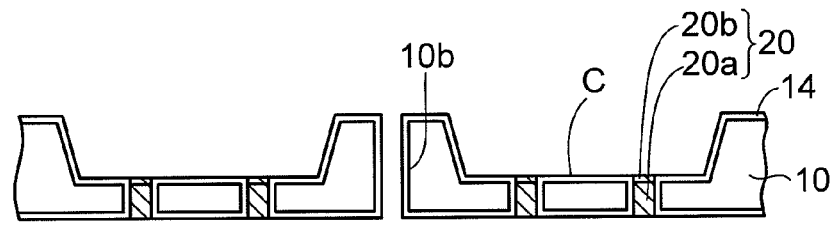

Then, as shown in FIG. 5C, the plating power feeding member 16 is removed, and the resist 18 filled in the penetration portions 10b is removed to expose the penetration portions 10b. The resist 18 is removed selectively from the silicon wafer 10, the insulating layer 14, and the penetration electrodes 20 by the resist stripper or the dry asking.

Figure 5D:
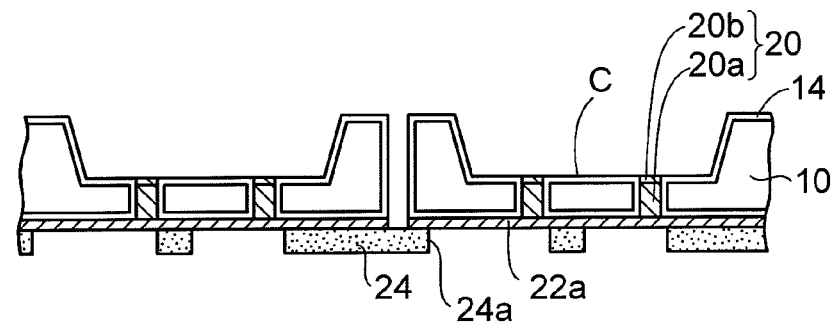

Then, as shown in FIG. 5D, a seed layer 22a is obtained by forming a Cu layer, or the like on the lower surface side of the silicon wafer 10 by the electroless plating or the sputter method. Also, parts of the seed layer 22a corresponding to the penetration portions 10b in the silicon wafer 10 are removed. Then, a plating resist 24 in which opening portions 24a are provided in areas where wiring layers are arranged is formed on the seed layer 22a by the photolithography.

Then, as shown in FIG. 6A, a conductive pattern layer 22b made of a Cu layer, or the like is formed in the opening portions 24a in the plating resist 24 by the electroplating utilizing the seed layer 22a as a plating power feeding path. Then, the plating resist 24 is removed, and then the seed layer 22a is etched by using the conductive pattern layer 22b as a mask.

Accordingly, as shown in FIG. 6B, wiring layers 22 each constructed by the seed layer 22a and the conductive pattern layer 22b are formed on the insulating layer 14 on the lower surface side of the silicon wafer 10. The wiring layer 22 is formed to be connected electrically to the penetration electrode 20.

In the case that the wiring layers 22 are formed by the above semi-additive process, a line:space of the wiring layers 22 can be set to 10:10 μm to 50:50 μm. The wiring layers 22 can be miniaturized remarkably in contrast to the case where the conventional ceramic package (wiring width: several hundreds μm) is employed.

Also, since the wafer process such as the sputter method, the photolithography, the dry etching, or the like can be also employed, the wiring layers 22 can be further miniaturized.

Then, as shown in FIG. 6C, the silicon wafer 10 is divided into individual silicon substrates 11 by cutting the coupling portion 10× (see the fragmental plan view in FIG. 5A) of the silicon wafer 10. Accordingly, a large number of wiring substrate areas A are separated, and individual wiring members 5 are obtained.

Then, as shown in FIG. 7A, the wiring member 5 in FIG. 6C is reversed up and down to direct the wiring layers 22 of the back surface side upward. Then, a gold wire 42a is put out from a capillary 40 of the wire bonder (not shown) by a predetermined length near a side surface S of the wiring member 5, and then a top end portion of the gold wire 42a is rounded spherically by the electric discharge.

Then, as shown in FIG. 7B, the capillary 40 is moved to a connection portion of the wiring layers 22 of the wiring member 5, and the gold wire 42a is made to contact the connection portion. Then, the gold wire 42a is bonded to the wiring layers 22 by the heating and the ultrasonic vibration. Then, the gold wire 42a is cut.

In the case that a nickel (Ni) layer/a gold (Au) layer are formed on the part that becomes the connection portion of the wiring layer 22 in order from the bottom, it is preferable from the viewpoint that the property of the wire bonding is improved.

By this matter, when the wiring member 5 in FIG. 7B is reversed up and down, as shown in FIG. 7C, metal wire terminals 42 that are connected to the connection portions of the wiring layers 22 on the lower surface side of the wiring member 5 and are extended upward along the side surface S from the lower surface side of the wiring member 5, is provided.

The metal wire terminals 42 formed of the gold wire 42a are illustrated. But the copper wire terminal, the aluminum terminal, or the like can be formed by the wire bonding method, or the like.

The insulating layer 14 is formed on the side surface S of the silicon substrate 11. Therefore, even though the metal wire terminals 42 contact the side surface S of the silicon substrate 11, it is not feared that a short-circuit is caused between the silicon substrate 11 and the metal wire terminals 42.

In the above manufacturing method, the insulating layer 14 is not partially formed on the side surfaces near four corners of the silicon substrate 11. But no problem particularly arises because, the metal wire terminals 42 are not arranged at four corners of the silicon substrate 11.

Alternatively, in the above manufacturing method, the penetration portions 10b (the step in FIG. 4A) may not be formed in the silicon substrate 11, and after individual wiring members are obtained by cutting the silicon wafer 10, an insulating layer may be formed by coating an insulating resin on the side surface of the silicon substrate 11, or the like. In this case, the insulating layer 14 can be formed on all side surfaces containing the side surfaces at four corners of the silicon substrate 11.

In this manner, the metal wire terminals 42 (connection terminals) connected to the wiring layer 22 are provided on the side surface S of the wiring member 5. Thus, a wiring substrate 1 of the present embodiment can be obtained.

As shown in FIG. 7C, in the wiring substrate 1 of the present embodiment, the concave portion C is provided in the center main portion on the upper surface side of the silicon substrate 11, and the through holes TH which penetrate the silicon substrate 11 are provided in the bottom portion of the concave portion C. The insulating layer 14 made of a silicon oxide layer is formed on both surfaces and side surfaces of the silicon substrate 11 and the inner surfaces of the through holes TH.

By providing the concave portion C in the center main portion of the silicon substrate 11, after the electronic component is mounted in the concave portion C, the electronic component can be hermetically sealed easily by providing the flat cap. In the case that the cap is not provided, the concave portion C may not always be provided in the silicon substrate 11.

Also, the penetration electrode 20 having the connection portion 20b at its uppermost portion is filled in the through holes TH respectively. The wiring layers 22 electrically connected to the penetration electrodes 20 are formed on the insulating layer 14 on the lower surface of the silicon substrate 11. Although not particularly shown, wiring layers connected to the penetration electrodes 20 may be formed on the bottom surface of the concave portion C of the silicon substrate 11.

Also, the metal wire terminals 42 connected to the connection portions of the wiring layers 22 on the lower surface side of the silicon substrate 11 are formed to extend upward along the side surface S of the silicon substrate 11. As described above, in the case that the metal wire terminals 42 are formed by the wire bonding method, such metal wire terminals 42 merely contact the side surface S of the silicon substrate 11, and are kept in a non-bonding state to the side surface S of the silicon substrate 11.

Then, the electronic component is to be mounted and connected to the connection portions 20b of the penetration electrodes 20 of the wiring substrate 1. In the case that the wiring layers connected to the penetration electrodes 20 are formed on the bottom surface of the concave portion C of the silicon substrate 11, the electronic component is to be mounted and connected to the connection portions of the wiring layers.

In FIG. 8, an example in which a MEMS acceleration sensor 30 (gyrosensor) is mounted on the wiring substrate 1 in FIG. 7C is shown. Connection electrodes 32 of the MEMS acceleration sensor 30 are mounted and connected to the connection portions 20b of the penetration electrodes 20 of the wiring substrate 1.

The connection electrode 32 of the MEMS acceleration sensor 30 is constructed by forming Ni layer/Au layer on the Al layer in order. Then, the connection electrode 32 of the MEMS acceleration sensor 30 (surface layer is the Au layer) and the connection portions 20b of the wiring substrate 1 (surface layer is the Au layer) are bonding by the ultrasonic bonding.

Then, a cap 46 is provided on the wiring substrate 1, and thus the MEMS acceleration sensor 30 is hermetically sealed in the concave portion C of the wiring substrate 1. The cap 46 is formed of silicon, and is fixed to the wiring substrate 1 by the Au—Sn bonding or the Au—In bonding.

Accordingly, an electronic device 2 of the present embodiment constructed by mounting the MEMS acceleration sensor 30 on the wiring substrate 1 with hermetically sealed state can be obtained.

The connection portions 20b of the wiring substrate 1 and the connection electrodes 32 of the MEMS acceleration sensor 30 can be formed of various metals, and also various connection systems can be employed.

In the present embodiment, after the metal wire terminals 42 are formed on the wiring member 5, the electronic component is mounted. But the electronic component may be mounted before the silicon wafer 10 is cut (state in FIG. 6B), or the metal wire terminals 42 may be formed after the electronic component is mounted on individual wiring members 5.

Next, a method of mounting the electronic device 2 of the present embodiment on the mounting substrate will be explained hereunder. The mounting substrate is a mounted body on which the electronic device is to be mounted, and is provided in various electronic equipments or machines, and the like. When the electronic device 2 on which the MEMS acceleration sensor 30 is mounted is mounted on the mounting substrate, in order to make the acceleration sensor function normally, it is necessary to mount the MEMS acceleration sensor 30 such that the substrate direction of the MEMS acceleration sensor 30 is arranged to the horizontal direction (lateral direction).

Figure 9A:
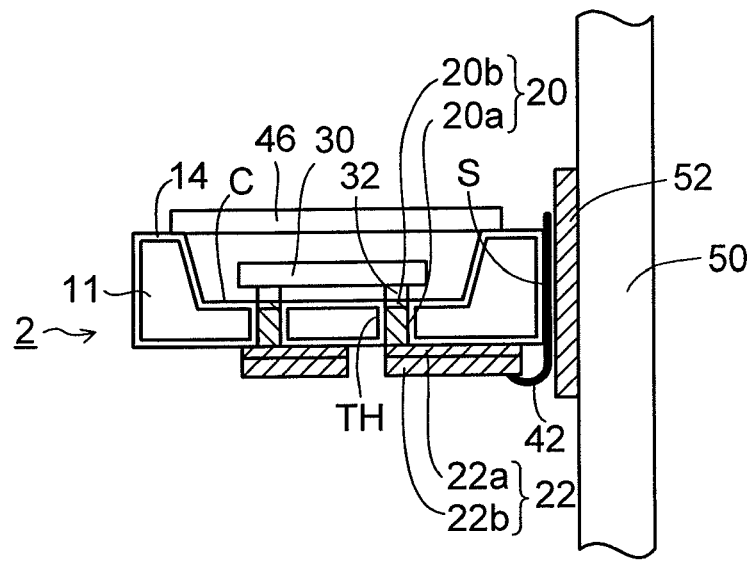
FIGS. 9A and 9B are sectional views showing a situation, in which metal wire terminals provided on a side surface of an electronic device according to the embodiment of the present invention are mounted on a mounting substrate being arranged in the vertical direction.

In the electronic device 2 of the present embodiment, since the metal wire terminals 42 are provided on the side surface S thereof, it is convenient in the case that the mounting substrate is arranged in the vertical direction (longitudinal direction). That is, as shown in FIG. 9A, in the case that a mounting substrate 50 is arranged upright in the vertical direction like the wall, the electronic device 2 of the present embodiment is mounted such that the metal wire terminals 42 on the side surface S thereof are connected to connection electrodes 52 of the mounting substrate 50.

Accordingly, in the case that the mounting substrate 50 is arranged upright in the vertical direction, the MEMS acceleration sensor 30 of the electronic device 2 can be arranged in the horizontal direction. As a result, it is possible to make the acceleration sensor function normally.

The connection electrode 52 of the mounting substrate 50 is constructed by forming a Ni layer/an Au layer on the Cu layer in order. Then, the metal wire terminals 42 (Au wires) of the electronic device 2 are bonded to the connection electrodes 52 (uppermost layer is the Au layer) of the mounting substrate 50 by the ultrasonic bonding.

Alternatively, the connection electrode 52 of the mounting substrate 50 may be constructed by forming a Ni layer/Au layer and an Sn—Au alloy layer on the Cu layer in order. In this case, the metal wire terminals 42 (Au wires) of the electronic device 2 are connected to the connection electrodes 52 (uppermost layer is the Sn—Au alloy layer) of the mounting substrate 50 by the Au—Sn bonding.

The metal wire terminals 42 of the electronic device 2 and the connection electrodes 52 of the mounting substrate 50 can be formed from various metals, and also various connection systems can be employed.

Figure 9B:
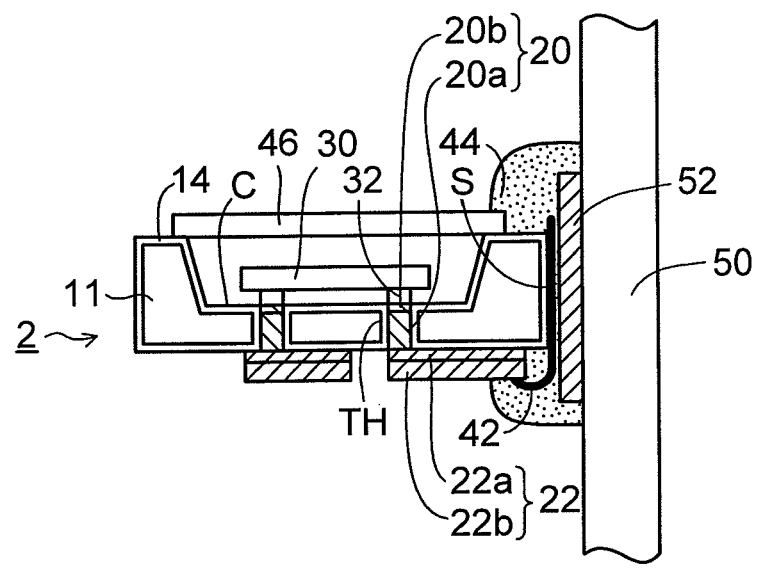

Also, as shown in FIG. 9B, a reinforcing resin 44 made of an epoxy resin, or the like is formed around the connection area with the mounting substrate 50, of the electronic device 2. By reinforcing the connection area of the electronic device 2 by the reinforcing resin 44, it can be prevented that the electronic device 2 inclines to the lower side and therefore reliability of the MEMS acceleration sensor 30 can be improved.

Figure 10A:
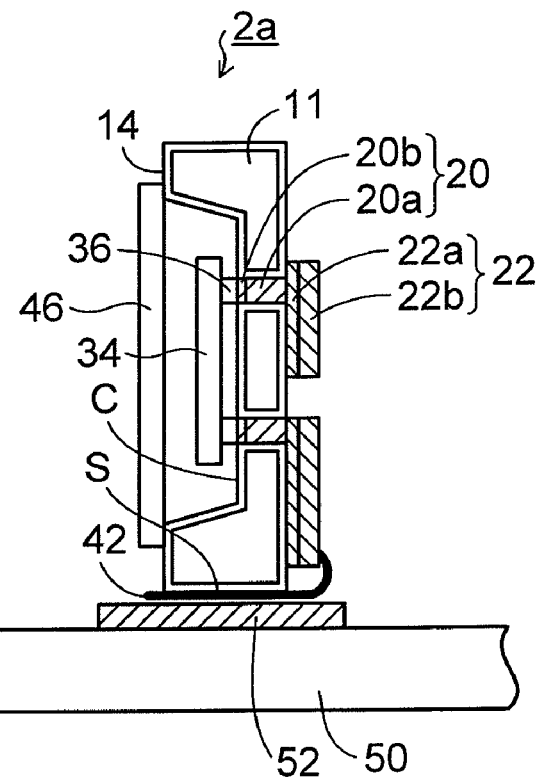
FIGS. 10A and 10B are sectional views showing a situation, in which metal wire terminals provided on a side surface of an electronic device according to the embodiment of the present invention are mounted on a mounting substrate being arranged in the horizontal direction.

Next, a mode in which the electronic device is mounted upright in the vertical direction on the mounting substrate which is arranged in the horizontal direction will be explained hereunder. In the case of this mode, as shown in FIG. 10A, connection electrodes 36 of a semiconductor chip 34 are flip-chip mounted on the connection portions 20b of the wiring substrate 1, and the cap 46 is fixed to the wiring substrate 1. Thus, an electronic device 2a is constructed. The mounting direction of the semiconductor chip 34 (LSI chip) such as CPU, memory, or the like is not particularly limited.

Then, the mounting substrate 50 is arranged in the horizontal direction, and the metal wire terminals 42 on the side surface S of the electronic device 2a are mounted and connected to the connection electrodes 52 of the mounting substrate 50. That is, the electronic device 2a is mounted on the mounting substrate 50 in a state that it stands in the vertical direction.

Figure 10B:
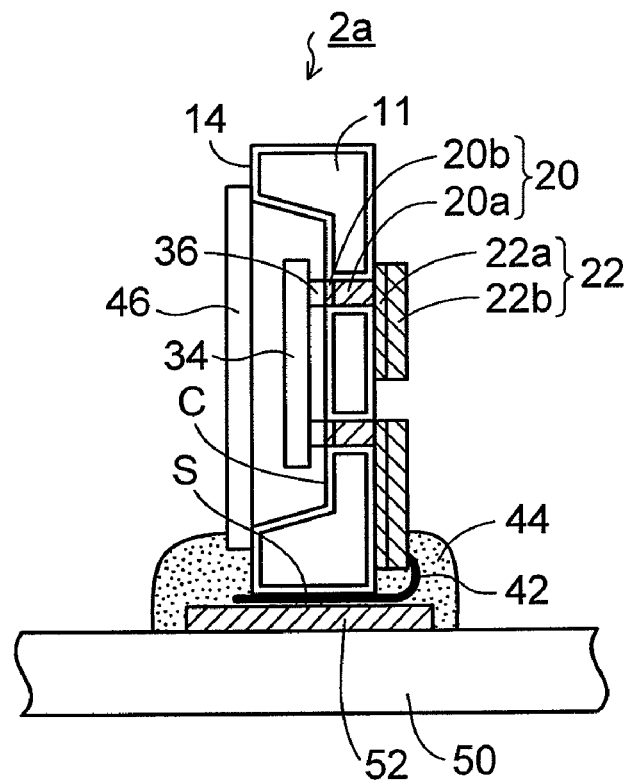

Then, as shown in FIG. 10B, like above FIG. 9B, the reinforcing resin 44 is provided around the connection area of the electronic device 2a.

When the mounting is done in this manner, it is necessary to secure a mounting area in some extent in the vertical direction (upper side) from the mounting substrate 50. However, a mounting area of the horizontal direction in the mounting substrate 50 can be made small.

Alternatively, like above FIG. 9B, the metal wire terminals 42 on the side surface S of the electronic device 2a, on which the semiconductor chip 34 is mounted, may be connected to the mounting substrates 50 arranged in the vertical direction, and the electronic device 2a may be mounted in the horizontal direction.

In this manner, in an electronic device mounting structure of the present embodiment, the metal wire terminals 42 on the side surface S of the electronic device 2 or 2a are connected to the connection electrodes 52 of the mounting substrate 50 such that the substrate direction of the electronic device 2 or 2a intersects orthogonally with the substrate direction of the mounting substrate 50.

Therefore, in above FIG. 10A and FIG. 10B, the electronic device 2a can be mounted on the lower surface side of the mounting substrate 50 such that the substrate direction of the electronic device 2a is set vertically.

As above, the MEMS acceleration sensor 30 and the semiconductor chip 34 are illustrated as the electronic component. But various active components or passive components such as capacitor, resistor, and the like may be mounted.

Figure 11A:
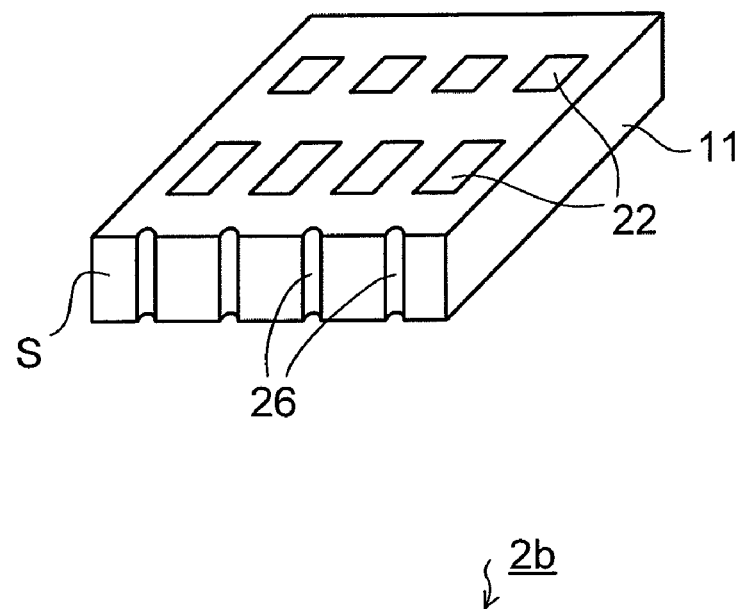
FIGS. 11A and 11B are perspective views showing an electronic device according to a variation of the embodiment of the present invention.
Figure 11B:
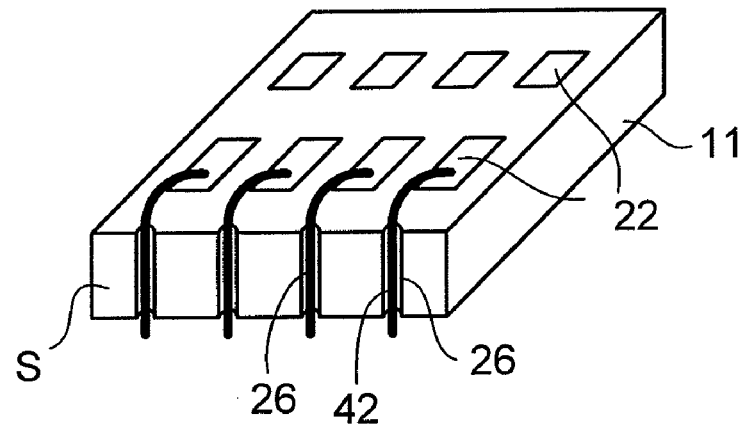

In FIG. 11B, an electronic device 2b according to a variation of the present embodiment is shown. In FIG. 11A and FIG. 11B, the back surface side (opposite surface to the surface on which the concave portion C is provided) of the silicon substrate 11 is depicted with perspective view.

In the electronic device 2b of the variation, as shown in FIG. 11A, grooves 26 into which the metal wire terminal 42 is fitted respectively are provided on the side surface S of the silicon substrate 11. The grooves 26 on the side surface S of the silicon substrate 11 are formed simultaneously in the step of forming the penetration portions 10b in foregoing FIG. 4A, and then are covered with the insulating layer 14.

Then, as shown in FIG. 11B, by the similar methods to those in above FIGS. 7A to 7C, the metal wire terminals 42 which are extended from the connection portions of the wiring layers 22 to the side surface S of the silicon substrate 11, are provided The metal wire terminals 42 are fitted into the grooves 26 on the side surface S of the silicon substrate 11, so that a level difference between the side surface S and the metal wire terminals 42 can be eliminated.

Figure 12A:
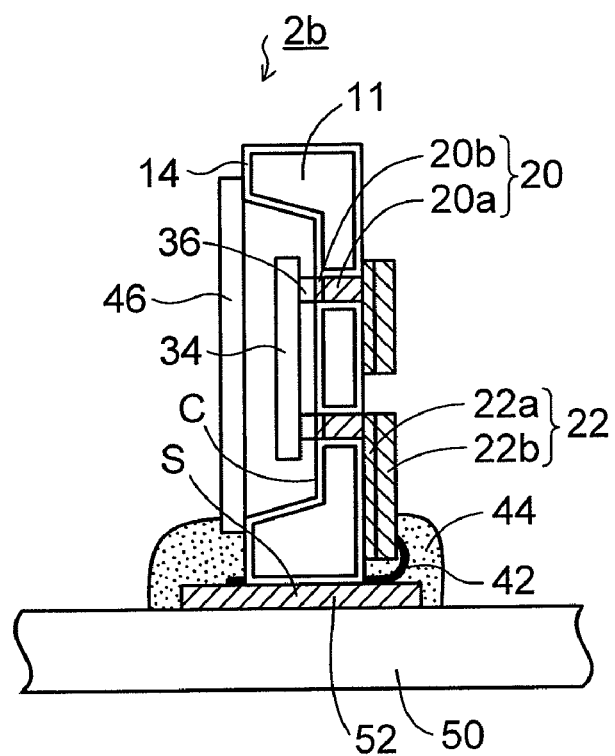
FIGS. 12A and 12B are a sectional view and a perspective view showing a situation, in which metal wire terminal provided on a side surface of an electronic device according to the variation of the embodiment of the present invention are mounted on a mounting substrate being arranged in the horizontal direction.

Then, as shown in FIG. 12A, like above FIG. 10A, the metal wire terminals 42 on the side surface S of the electronic device 2b are mounted and connected to the connection electrodes 52 of the mounting substrate 50 arranged in the horizontal direction. Then, the reinforcing resin 44 is provided around the connection area of the electronic device 2b.

Figure 12B:
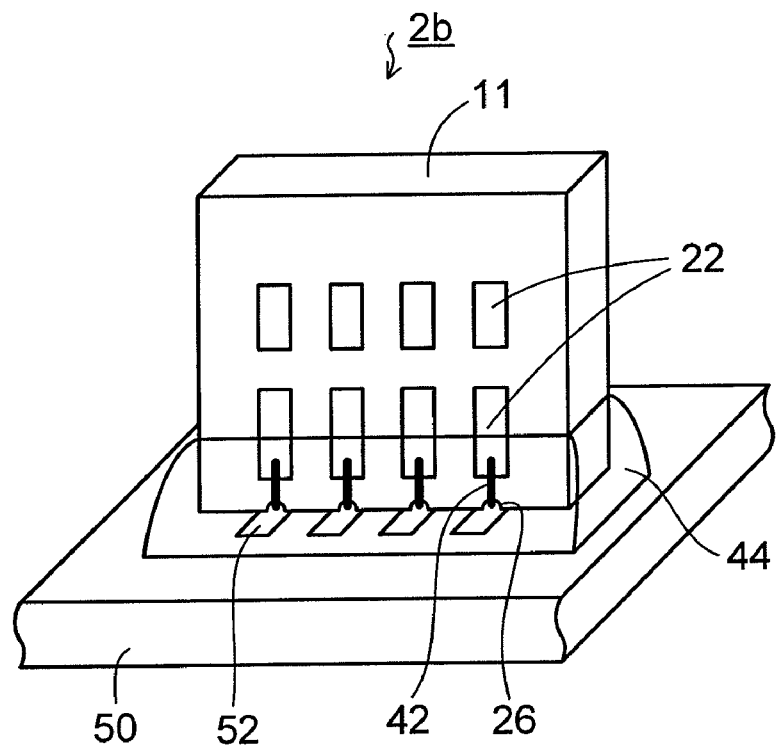

By reference to FIG. 12B together, a level difference between the side surface S and the metal wire terminals 42 can be eliminated because the metal wire terminals 42 are fitted into the grooves 26 on the side surface S of the silicon substrate 11. Therefore, the side surface S of the silicon substrate 11 of the electronic device 2b is arranged stably on the mounting substrate 50. In FIG. 12B, in order to facilitate the explanation, the reinforcing resin 44 is depicted transparently.

Accordingly, unsteadiness of the electronic device 2b can be reduced upon arranging the electronic device 2b on the mounting substrate 50. As a result, the metal wire terminals 42 of the electronic device 2b can be connected to the connection electrodes 52 of the mounting substrate 50 with good reliability.

In the electronic device 2b of the variation, like above FIG. 9A and FIG. 9B, the electronic device 2b may be mounted in the horizontal direction by connecting the metal wire terminals 42 on the side surface S of the electronic device 2b to the mounting substrate 50 arranged in the vertical direction.

What is claimed is:

1. A wiring substrate, comprising:
   a silicon substrate;
   a through hole formed to penetrate the silicon substrate in a thickness direction;
   an insulating layer formed on both surfaces and side surfaces of the silicon substrate and an inner surface of the through hole;
   a penetration electrode formed in the through hole;
   a wiring layer formed on at least one surface of the silicon substrate, and connected to the penetration electrode; and
   a metal wire terminal connected to the wiring layer, and formed to extend from the one surface of the silicon substrate to a side surface thereof.

2. A wiring substrate according to claim 1, wherein the metal wire terminal is made of a gold wire formed by a wire bonding method.

3. A wiring substrate according to claim 1, wherein a concave portion is provided in a center portion on an opposite surface side to a surface on which the wiring layer is formed, of the silicon substrate,
   and the through hole and the penetration electrode are arranged to a bottom portion of the concave portion.

4. A wiring substrate according to claim 1, wherein a groove is provided in the side surface of the silicon substrate on which the metal wire terminal is provided, in a thickness direction, and the metal wire terminal is arranged in the groove.

5. An electronic device, comprising:
   a wiring substrate including
      a silicon substrate,
      a through hole formed to penetrate the silicon substrate in a thickness direction,
      an insulating layer formed on both surfaces and side surfaces of the silicon substrate and an inner surface of the through hole,
      a penetration electrode formed in the through hole,
      a wiring layer formed on at least one surface of the silicon substrate, and connected to the penetration electrode, and
      a metal wire terminal connected to the wiring layer, and formed to extend from the one surface of the silicon substrate to a side surface thereof; and
   an electronic component mounted on an opposite surface side to a surface on which the wiring layer is formed, of the silicon substrate, and connected electrically to the penetration electrode.

6. An electronic device mounting structure, comprising:
   a wiring substrate including a silicon substrate, a through hole formed to penetrate the silicon substrate in a thickness direction, an insulating layer formed on both surfaces and side surfaces of the silicon substrate and an inner surface of the through hole, a penetration electrode formed in the through hole, a wiring layer formed on at least one surface of the silicon substrate, and connected to the penetration electrode, and a metal wire terminal connected to the wiring layer, and formed to extend from the one surface of the silicon substrate to a side surface thereof; and an electronic component mounted on an opposite surface side to a surface on which the wiring layer is formed, of the silicon substrate, and connected electrically to the penetration electrode; and a mounting substrate on which the electronic device that the electronic component is mounted on the wiring substrate is mounted, and in which the metal wire terminal on the side surface of the electronic device is connected to a connection electrode of the mounting substrate such that a substrate direction of the electronic device intersects orthogonally with a substrate direction of the mounting substrate.

7. An electronic device mounting structure according to claim 6, wherein the mounting substrate is arranged upright in a vertical direction, and the substrate direction of the electronic device is arranged in a horizontal direction.

8. An electronic device mounting structure according to claim 7, wherein the electronic component is a MEMS acceleration sensor.

9. An electronic device mounting structure according to claim 6, wherein a reinforcing resin is provided around a connection area with the mounting substrate, of the electronic device.

10. An electronic device mounting structure according to claim 6, wherein the metal wire terminal of the electronic device is made of a gold wire, and an uppermost layer of the connection electrode of the mounting substrate is made of a gold layer or a gold-tin alloy layer, and the metal wire terminal of the electronic device and the connection electrode of the mounting substrate are connected by a gold-gold ultrasonic bonding or a gold-tin bonding.

* * * * *